United States Patent [19]
Schäfer

[11] Patent Number: 4,525,924
[45] Date of Patent: Jul. 2, 1985

[54] METHOD FOR PRODUCING A PLURALITY OF SEMICONDUCTOR CIRCUITS

[75] Inventor: Horst Schäfer, Zirndorf, Fed. Rep. of Germany

[73] Assignee: Semikron Gesellschaft für Gleichrichterbau und Elektronik, Nuremberg, Fed. Rep. of Germany

[21] Appl. No.: 503,078

[22] PCT Filed: Dec. 11, 1979

[86] PCT No.: PCT/DE79/00145

§ 371 Date: Aug. 14, 1980

§ 102(e) Date: Aug. 14, 1980

[87] PCT Pub. No.: WO80/01334

PCT Pub. Date: Jun. 26, 1980

Related U.S. Application Data

[62] Division of Ser. No. 204,362, Aug. 14, 1980, abandoned.

[30] Foreign Application Priority Data

Dec. 23, 1978 [DE] Fed. Rep. of Germany ....... 2855972

[51] Int. Cl.[3] .................... H01L 21/461; H01L 21/80

[52] U.S. Cl. ........................................ 29/580; 29/581; 29/582; 29/571; 148/33.2; 148/187; 357/55

[58] Field of Search ......................... 29/580, 581, 582; 148/DIG. 51, 33.2, 187; 357/39, 55, 86, 20, 56

[56] References Cited

U.S. PATENT DOCUMENTS

| | | | |
|---|---|---|---|
| 2,748,041 | 5/1956 | Leverenz | 148/33.2 |
| 2,985,805 | 5/1961 | Nelson | 148/33.2 |
| 3,005,937 | 10/1961 | Wallmark et al. | 148/33.2 |
| 3,039,028 | 6/1962 | Ross | 357/21 |
| 3,519,900 | 7/1970 | Lawrence . | |
| 3,673,468 | 6/1972 | Schafer | 357/55 |
| 3,699,402 | 10/1972 | McCann et al. | 357/55 |
| 3,706,129 | 12/1972 | McCann et al. . | |
| 3,814,639 | 6/1974 | Dumas | 357/39 |
| 3,887,993 | 6/1975 | Okada et al. | 357/42 |
| 3,972,113 | 8/1976 | Nakata et al. | 29/580 |
| 3,978,514 | 8/1976 | Ogawa et al. | 357/39 |
| 4,118,257 | 10/1978 | Oberreuter et al. | 357/39 |
| 4,219,835 | 8/1980 | van Loon et al. | 357/55 |

FOREIGN PATENT DOCUMENTS

| | | |
|---|---|---|
| 1805261 | 6/1969 | Fed. Rep. of Germany . |
| 992963 | 5/1965 | United Kingdom . |

OTHER PUBLICATIONS

*IBM Technical Disclosure Bulletin,* Elimination of Superheating in Liquid Encapsulated Semiconductor Modules, Hornung et al., vol. 19, No. 3, Aug. 1976.

*Primary Examiner*—Brian E. Hearn
*Assistant Examiner*—H. L. Auyang
*Attorney, Agent, or Firm*—Spencer & Frank

[57] ABSTRACT

A method for producing a semiconductor arrangement of two antiparallel connected diodes comprising a semiconductor body which includes a base region of one conductivity type and a zone adjacent each side of the base region. Each zone forms a pn-junction with the base region and thus a diode structure and is offset with respect to the other zone. The major surfaces formed by each base region and one of the two zones are provided with a contact metal coating so as to electrically connect the two diode structures. In accordance with this method, a layer sequence of three zones with pn-junctions therebetween is formed by diffusion on a semiconductor starting disc. Then, mutually parallel recesses are produced with the aid of masking in each major surface of the disc according to a strip-shaped structure, offset with respect to that of the other major surface, by removing material to beyond the respective pn-junction. Both major surfaces are metallized and the disc is divided along the recesses into semiconductor arrangements.

13 Claims, 2 Drawing Figures

II
I
6
p
n+
5
2
J1
n
1
J2
p
n+
3
7
4
m1
m1

II
I
m1
m2
1
3
2
20
10
J1
J2

METHOD FOR PRODUCING A PLURALITY OF SEMICONDUCTOR CIRCUITS

This application is a division of application Ser. No. 06/204,362, filed Aug. 14, 1980 now abandoned.

Background of the Invention

The invention relates to a method for producing a semiconductor arrangement comprising two antiparallel connected diodes.

Antiparallel connections of diodes are used in control and regulating circuits, for example in d.c. converters. They may comprise two discrete individual elements and may be combined and interconnected on a substrate into a structural unit.

However, modern semiconductor technology also makes it possible to arrange spatially separated layer sequences as diode structures which are integrated in a semiconductor body and which are interconnected in an antiparallel arrangement with the aid of conductor paths.

The drawbacks of the combination of discrete components are the separate costs for the manufacture of the individual elements and for their assembly and interconnection as well as the often undesirable large space requirement and the resulting limitations with respect to use. The drawbacks of the integrated arrangement are, in view of the low electrical demands that can be placed on such circuits, the high costs for the special diffusion and masking steps.

It is the object of the invention to find an anti-parallel connection of diodes which includes the most favorable combination of individual elements with respect to their configuration and manufacture.

Summary of the Invention

The solution of this problem resides in a semiconductor arrangement of the above-mentioned type which includes a semiconductor body having a base region in the form of a zone of the one conductivity type and a further, smaller-area zone adjacent each side of the base region and forming a pn-junction therewith, this further zone being offset with respect to the corresponding zone on the other side of the base region, each such further zone being intended for a diode structure which is spatially and electrically antiparallel to the other such zone. The semiconductor arrangement is also provided with contact metal coatings to electrically connect both diode structures.

A modification is provided in that the free surface section of the base region in each diode structure is provided with a highly doped surface layer of the same conductivity type.

The problem is solved further by a method for producing such a semiconductor arrangement wherein a layer sequence of a center zone and two further zones with pn-junctions therebetween is formed in a semiconductor starting disc of one conductivity type between its major surfaces by diffusing doping material of the other conductivity type from both sides. In this process, the starting disc, after masking, is provided on both sides with a pattern representing a structure of groove-like, mutually parallel recesses which are placed in an offset arrangement with respect to the other side and which interrupt the respectively closest pn-junction. A coating of at least one contact metal is applied to each side of the starting disc and the disc is divided, at least along all of the recesses, into semiconductor components of smaller areal expanse each containing antiparallel diode structures.

The recesses may also be produced by etching or ultrasonic drilling or also by sawing.

The thin, highly doped layer of the same conductivity type provided in the areal sections of the base region which have been exposed by the recesses may be produced by diffusion or by vapor deposition and alloying of doping material.

The contact metal coatings may be produced by electroless deposition of contact metals or by vapor deposition and alloying.

In order to improve the adhesion of the contact metal coatings, the surfaces of the starting disc may be roughened by sand-blasting.

An advantageous modification of the method resides in that contact metals are used which form an ohmic contact with the semiconductor material of the starting disc and that the thin, highly doped layer and the contact metal coatings are produced in one process step.

The advantage of the invention resides in that a compact arrangement of an antiparallel connection of two diodes can be realized with a minimum of well-known process steps, the arrangement meeting all technical requirements.

Description of a Preferred Embodiment

Figure 1:
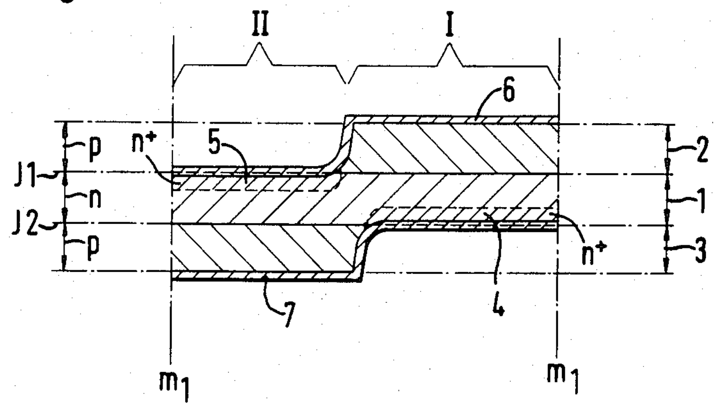
FIG. 1 is a cross-sectional view of the configuration of the semiconductor arrangement according to the invention.

The semiconductor body according to FIG. 1 includes an np structure I corresponding to a first diode and an identical, spatially oppositely oriented structure II which is offset in the zone plane and corresponds to a second, antiparallel diode. Both structures have essentially coinciding areal expanses and the same thickness.

Both structures have in common a center, n-conductive base region or semiconductor element 1 bordered on one side by the p-conductive zone or semiconductor element 2, thus forming the pn-junction J1 and consequently the structure I and at whose other side following in space after the structure I there is the p-conductive zone or semiconductor element 3 with the thus formed pn-junction J2 and consequently the structure II.

The pn-junction J1 of the structure I comes to the surface at both end faces of the zone 2 and the pn-junction J2 comes to the surface at both end faces of the zone 3.

The thickness of the zones of both structures I and II as well as their areal expanse are essentially determined by the physical and electrical properties required during use.

The structures are charged only in the forward direction so that special measures for surface stabilization and improving the blocking capability are not needed.

The transition from one structure to the other, i.e. the shaping of the edge faces of the further zones 2, 3, is not critical and, pursuant to the provided manufacturing methods for forming the base region of each structure, such transition is essentially perpendicular to the zone plane of the arrangement.

In order to improve contacting of the semiconductor body in the free surface section of the base region 1 of each diode structure, the semiconductor body is provided with a highly doped, thin surface layer 4 or 5, respectively, of the same conductivity type. In the illustrated embodiment, the respective sections are $n^+$ conductive.

Moreover, both surfaces of the semiconductor body which are stepped in the same sense are each provided with a contact metal coating 6 or 7, respectively, which may also be formed of partial layers.

Aluminum, silver, nickel are provided as contact metals, for example.

In an advantageous manner, contact metals can be used which are suitable to form a ohmic contact with the semiconductor material, e.g. aluminum or a compound of gold and antimony. This makes possible the production of the thin, highly doped layer 4 or 5, respectively, and the contact metal coating 6 or 7, respectively, in one process step.

FIG. 1 indicates that the semiconductor arrangement according to the invention can surprisingly easily be made of a layer sequence including three layer-shaped zones of alternatingly opposite conductivity types, e.g., a pnp structure, and that moreover it is of particular advantage to produce the arrangement on a larger starting body by then dividing that body along marking lines $m_1$.

Figure 2:
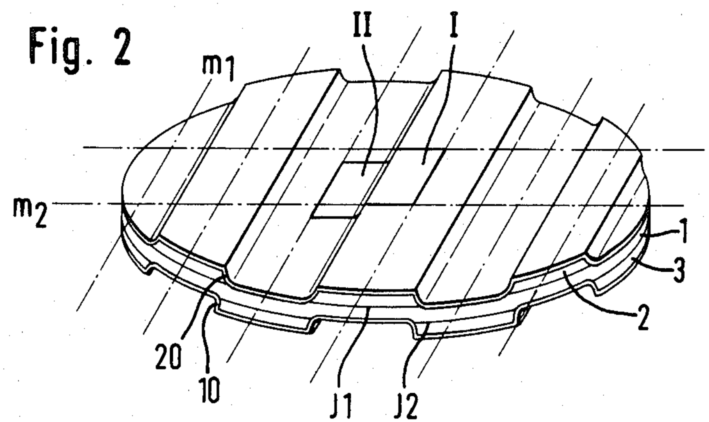
FIG. 2 is a perspective view of a semiconductor starting disc from which the semiconductor arrangements are made.

The manufacture of the device according to the invention advantageously begins with a large-area semiconductor disc of a first conductivity type as shown in a perspective view in FIG. 2, wherein corresponding parts are designated by the same numerals as those used in FIG. 1. By known bilateral diffusion of impurities of the other conductivity type, i.e. a boron diffusion at temperatures above 1200° C. into an n-conductive starting disc, a pnp layer sequence 1, 2, 3 is produced.

To obtain mutually offset arrangements of diode structures, the starting disc is provided on both sides with recesses 10 or 20, respectively, according to a pattern determined by the areal expanse and shape of the intended semiconductor elements. For this purpose, the starting disc is, for example, masked appropriately on both sides and subjected to an etching process in which mutually parallel groove-shaped recesses 10 or 20, respectively, are produced on each side in an arrangement that is offset with respect to recesses on the other side so as to interrupt the respectively adjacent pn-junction. These recesses, when completed, form an approximately meander-shaped cross section of the disc.

Known etching solutions are used for the etching treatment of the starting disc.

The recesses 10, 20 may advantageously also be produced by ultrasonic drilling or by sawing.

Subsequent to the formation of the recesses, the thin, highly doped surface layer 4, 5 is produced in their bottom surface to a thickness up to about $20\mu$ with the conductivity type of the base region 1. This may be done by a known diffusion, e.g. of phosphorus or boron. Just as advantageously, the surface layer 4, 5 may also be produced by vapor deposition and alloying in, in a known manner, a constant metal having doping properties, e.g. aluminum or gold-antimony, so that, in a particularly favorable manner with respect to manufacturing techniques, the contact metal coatings 6, 7, i.e., the contact electrodes for the semiconductor body, can be produced simultaneously.

If these coatings 6, 7 are manufactured by electroless deposition of contact metals, e.g. nickel, their adhesion to the semiconductor surface can be improved by sand blasting.

Finally, the disc is divided along the marking lines $m_1$, $m_2$ into components of smaller areal expanse, as indicated particularly in FIG. 2. This may be done advantageously with the aid of the laser technique.

I claim:

1. A method for producing a plurality of semiconductor circuits each consisting of two antiparallel connected diodes, comprising the steps of preparing a semiconductor element having first and second opposite surfaces, said semiconductor element being of one conductivity type;

diffusing doped material of the opposite conductivity type into both surfaces of said semiconductor element to provide a semiconductor starting disc having first and second pn-junctions formed at the first and second surfaces of said semiconductor element by said diffused doping material;

forming a plurality of groove-shaped mutually parallel recesses in each side of said semiconductor starting disc which penetrate said first and second pn-junctions to expose portions of the surfaces of said semiconductor element, the recesses on one side of said semiconductor starting disc being offset in a direction parallel to the surfaces of said semiconductor element with respect to the recesses on the opposite side of said starting disc;

coating each side of said semiconductor starting disc with at least one contact metal; and dividing said coated semiconductor starting disc into segments each of which contains two antiparallel connected diodes.

2. Method according to claim 1 which, immediately after formation of said groove-shaped mutually parallel recesses in each side of said semiconductor disc, comprises the further step of producing a thin highly doped layer of said one conductivity type in the exposed portions of the surfaces of said semiconductor element.

3. Method according to claim 2 wherein said contact metal coatings are produced by electroless deposition of contact metals.

4. Method according to claim 2 wherein said contact metal coatings are produced by vapor deposition and alloying.

5. Method according to claim 2, wherein said thin, highly doped layer is produced by diffusion.

6. Method according to claim 2, wherein said thin, highly doped layer is produced by vapor deposition and alloying of doping metals.

7. Method according to claim 2 wherein contact metals are used which form an ohmic contact with said semiconductor starting disc and said thin, highly doped layer and the contact metal coatings are produced in one process step.

8. Method according to claim 1, wherein said recesses are formed by etching.

9. Method according to claim 1, wherein said recesses are formed by ultrasonic drilling.

10. Method according to claim 1, wherein said recesses are formed by sawing.

11. Method according to claim 1 wherein said contact metal coatings are produced by electroless deposition of contact metals.

12. Method according to claim 11, wherein in order to improve adhesion of the contact metal coatings, the surfaces of said semiconductor starting disc are roughened by sand blasting.

13. Method according to claim 1 wherein said contact metal coatings are produced by vapor deposition and alloying.

* * * * *